United States Patent
Kanbayashi

(10) Patent No.: US 12,186,939 B2
(45) Date of Patent: Jan. 7, 2025

(54) METHOD FOR SLICING INGOT AND WIRE SAW

(71) Applicant: SHIN-ETSU HANDOTAI CO., LTD., Tokyo (JP)

(72) Inventor: Keiichi Kanbayashi, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 959 days.

(21) Appl. No.: 17/042,236

(22) PCT Filed: Apr. 10, 2019

(86) PCT No.: PCT/JP2019/015533
§ 371 (c)(1),
(2) Date: Sep. 28, 2020

(87) PCT Pub. No.: WO2019/220820
PCT Pub. Date: Nov. 21, 2019

(65) Prior Publication Data
US 2021/0114257 A1    Apr. 22, 2021

(30) Foreign Application Priority Data
May 15, 2018 (JP) .................... 2018-94020

(51) Int. Cl.
*B28D 5/04*     (2006.01)
*B24B 27/06*    (2006.01)
*B28D 5/00*     (2006.01)

(52) U.S. Cl.
CPC .......... *B28D 5/045* (2013.01); *B24B 27/0633* (2013.01); *B28D 5/0082* (2013.01)

(58) Field of Classification Search
CPC .... B28D 5/0082; B28D 5/045; B28D 5/0064; B28D 5/0076; B24B 27/0633
(Continued)

(56) References Cited

U.S. PATENT DOCUMENTS

| 6,652,356 | B1 * | 11/2003 | Ariga ................ | B28D 5/045 |
| | | | | 125/16.02 |
| 2010/0163010 | A1 * | 7/2010 | Kitagawa .......... | B28D 5/0064 |
| | | | | 451/60 |
| 2011/0088678 | A1 | 4/2011 | Kitagawa | |

FOREIGN PATENT DOCUMENTS

| CN | 101678563 A | 3/2010 |
| JP | H05-185419 A | 7/1993 |
(Continued)

OTHER PUBLICATIONS

Jul. 9, 2019 International Search Report issued in International Patent Application No. PCT/JP2019/015533.
(Continued)

*Primary Examiner* — Katina N. Henson
(74) *Attorney, Agent, or Firm* — Oliff PLC

(57) ABSTRACT

A method for slicing an ingot, including: forming a wire row by a wire spirally wound between a plurality of wire guides and configured to travel in an axial direction; and pressing an ingot against the wire row while supplying a contact portion between the ingot and the wire with a slurry from a nozzle, thereby slicing the ingot into wafers. The slurry is supplied such that slurries whose temperatures are separately controlled by two or more lines of heat exchangers are respectively supplied from two or more sections of the nozzle which are orthogonal to a travelling direction of the wire row. Consequently, a wire saw and a method for slicing an ingot are provided which enable separate control of wafer shapes depending on ingot-slicing positions.

14 Claims, 7 Drawing Sheets

(58) Field of Classification Search
USPC .................................................... 125/16.02
See application file for complete search history.

(56) References Cited

FOREIGN PATENT DOCUMENTS

| | | |
|---|---|---|
| JP | 2009-029078 A | 2/2009 |
| JP | 2010-029955 A | 2/2010 |
| JP | 5003294 B2 | 8/2012 |
| KR | 10-2010-0020463 A | 2/2010 |

OTHER PUBLICATIONS

Sep. 28, 2021 Office Action issued in Chinese Patent Application No. 201980025003.1.
Dec. 6, 2022 Office Action issued in Chinese Patent Application No. 201980025003.1.
Apr. 22, 2022 Office Action issued in Chinese Patent Application No. 201980025003.1.
Sep. 7, 2022 Office Action issued in Chinese Patent Application No. 201980025003.1.
Mar. 14, 2024 Office Action issued in Korean Patent Application No. 10-2020-7028816.

\* cited by examiner

[FIG. 1]
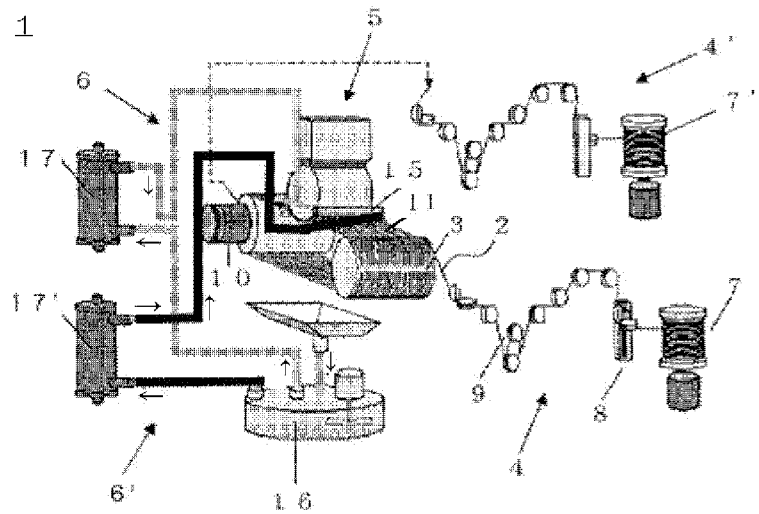
[FIG. 2]
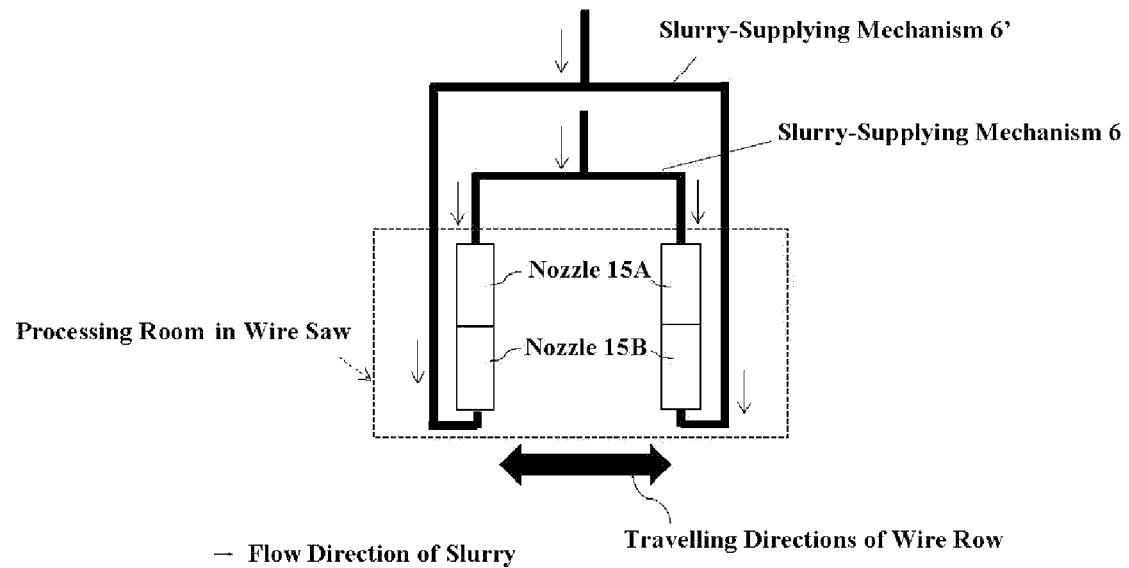

[FIG. 3]
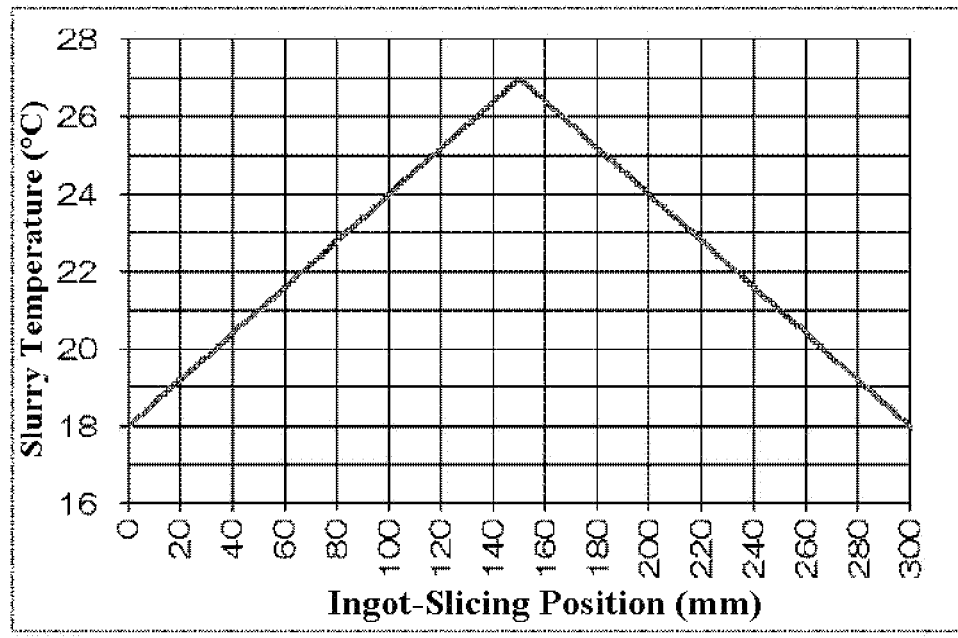
[FIG. 4]
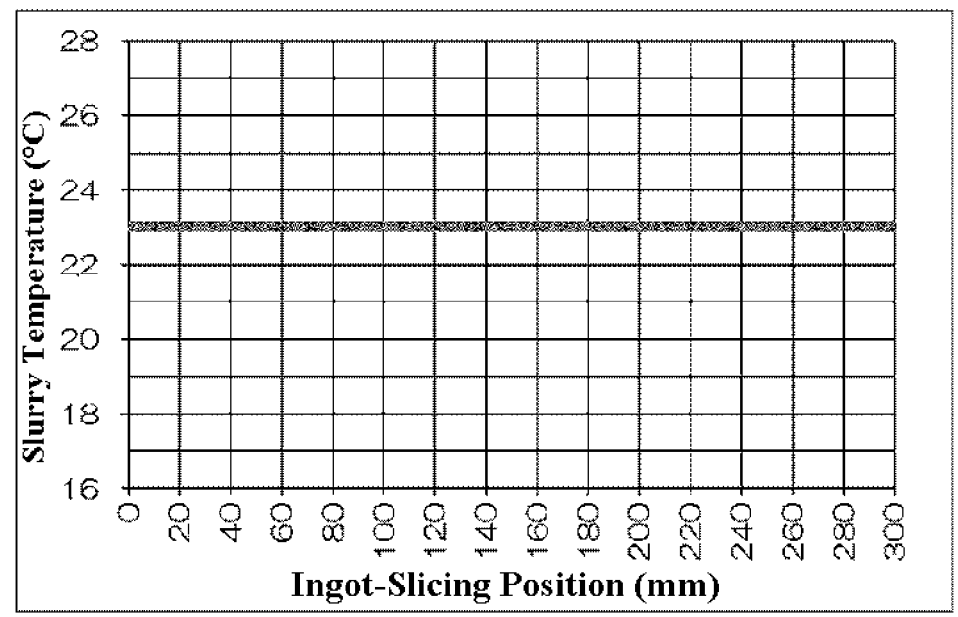

[FIG. 5]
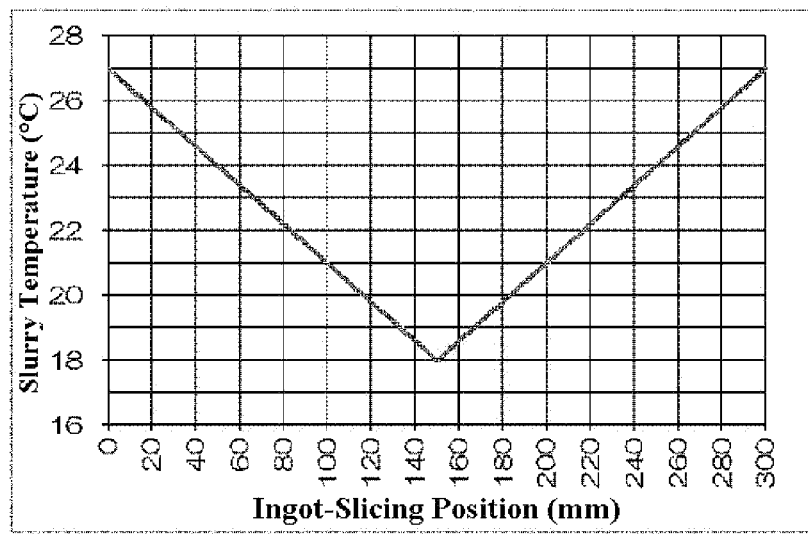
[FIG. 6]
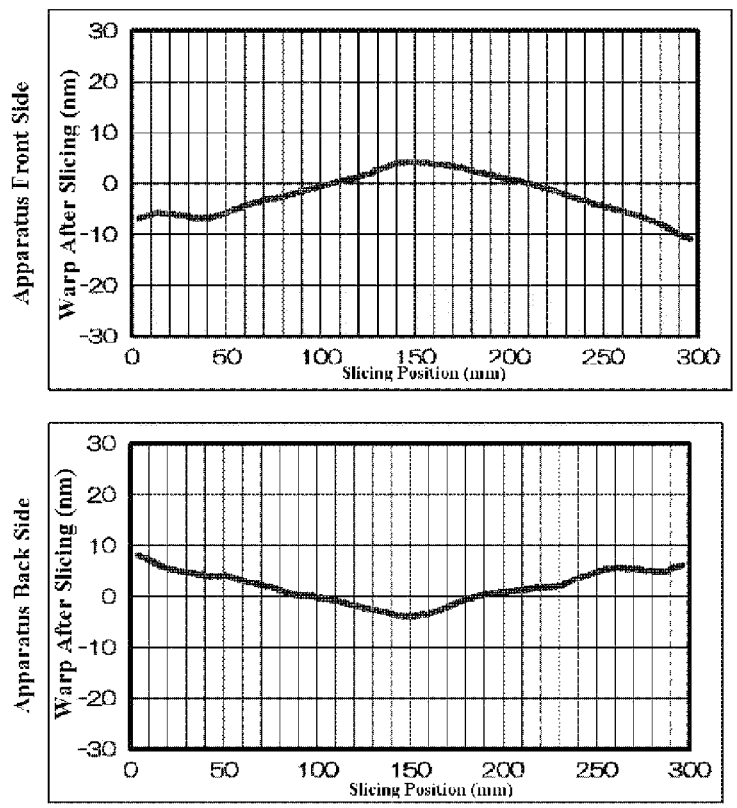

[FIG. 7]
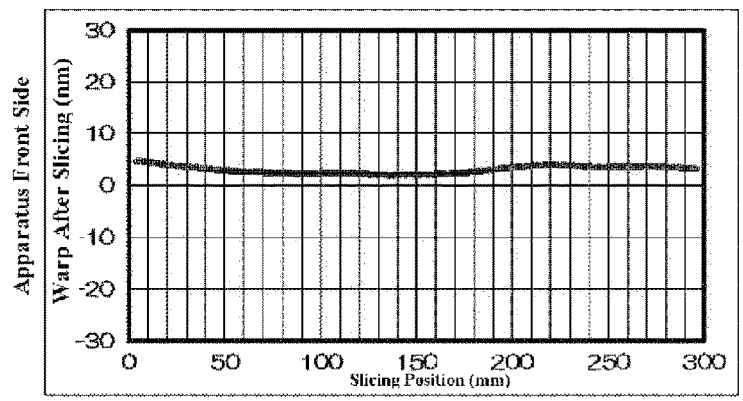
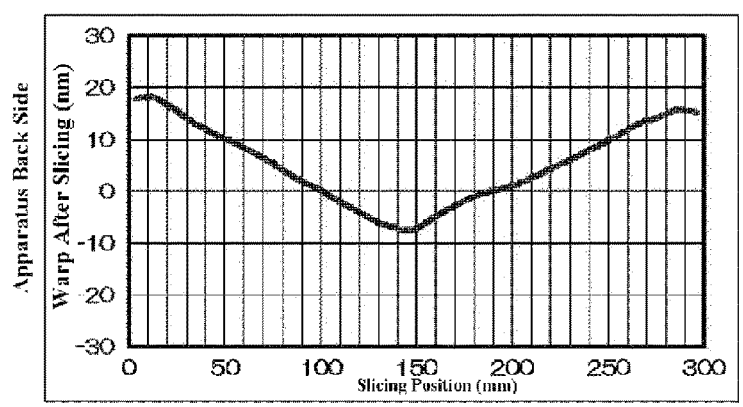
[FIG. 8]
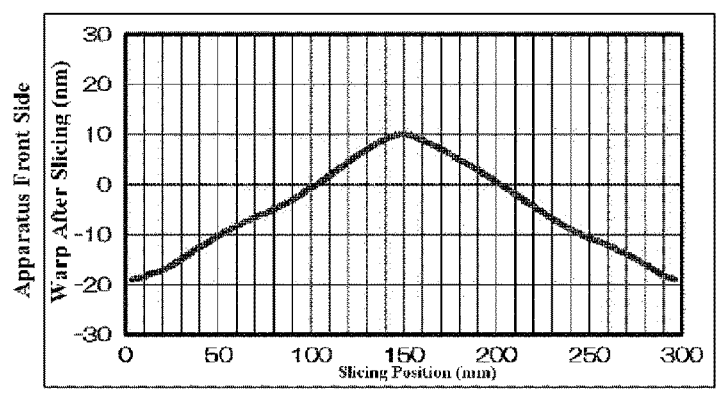
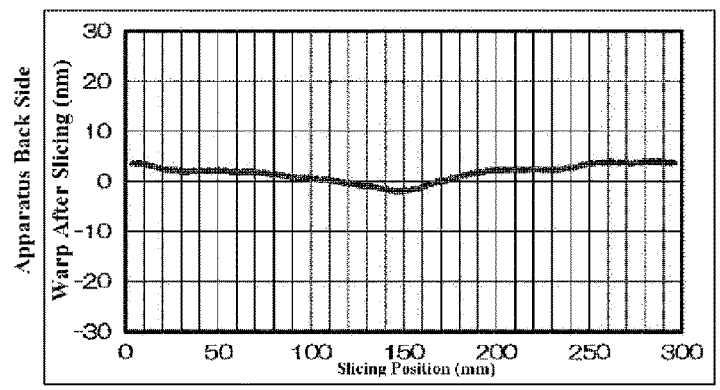

[FIG. 9]
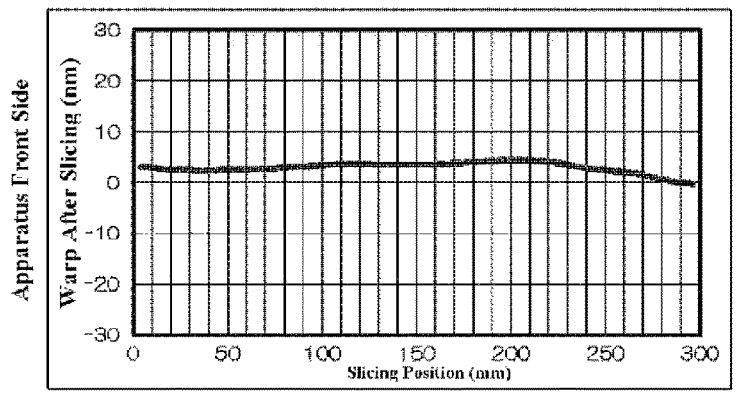
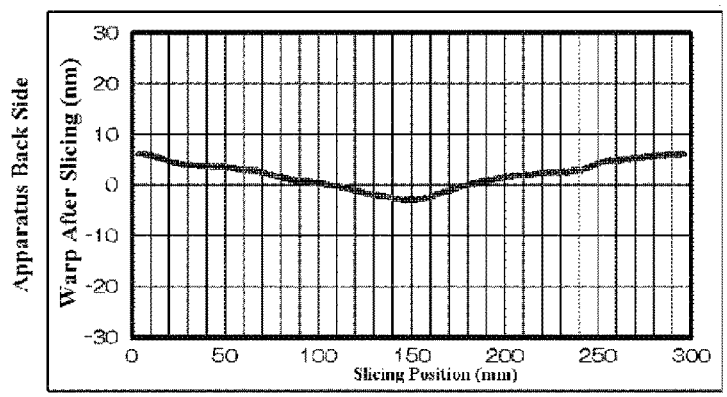
[FIG. 10]
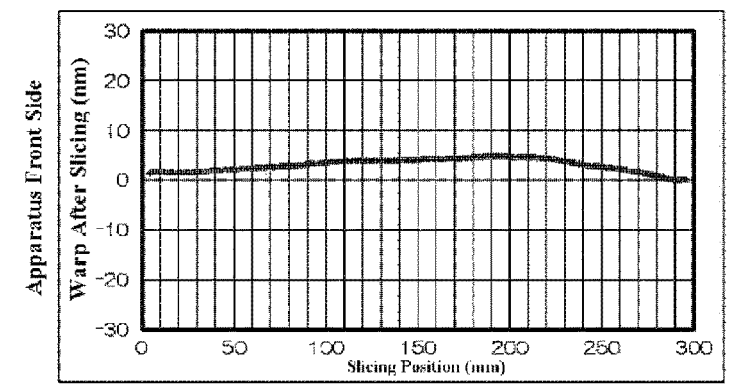
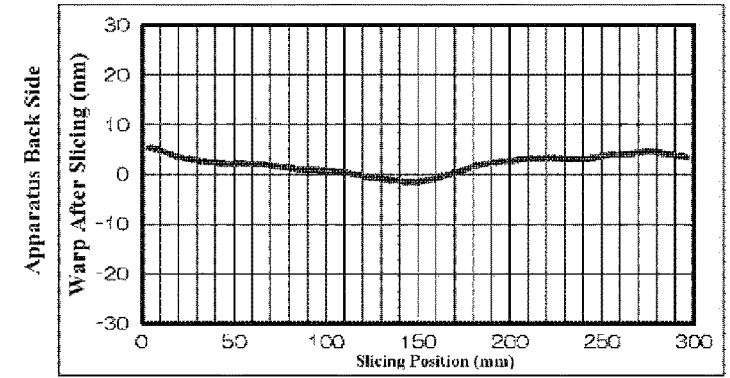

[FIG. 11]
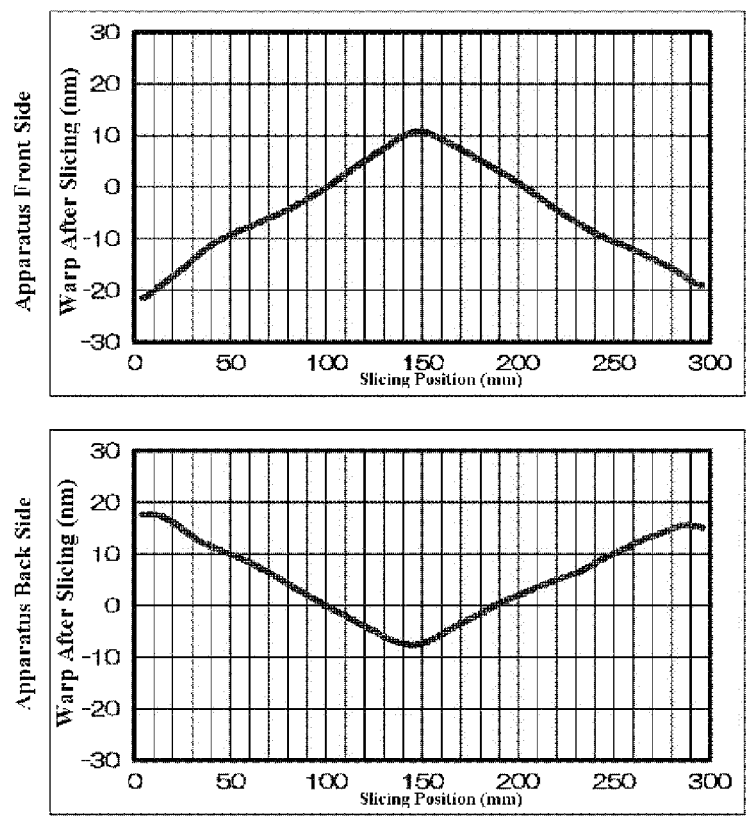
[FIG. 12]
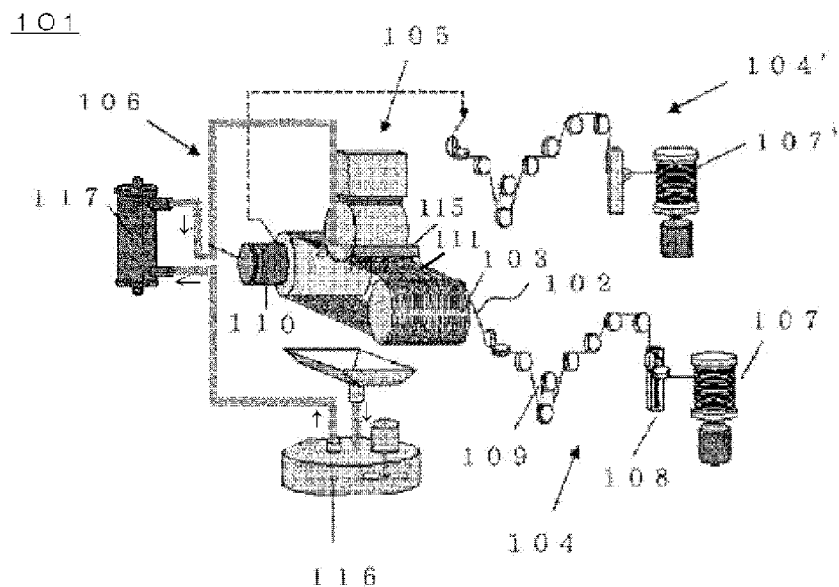

[FIG. 13]
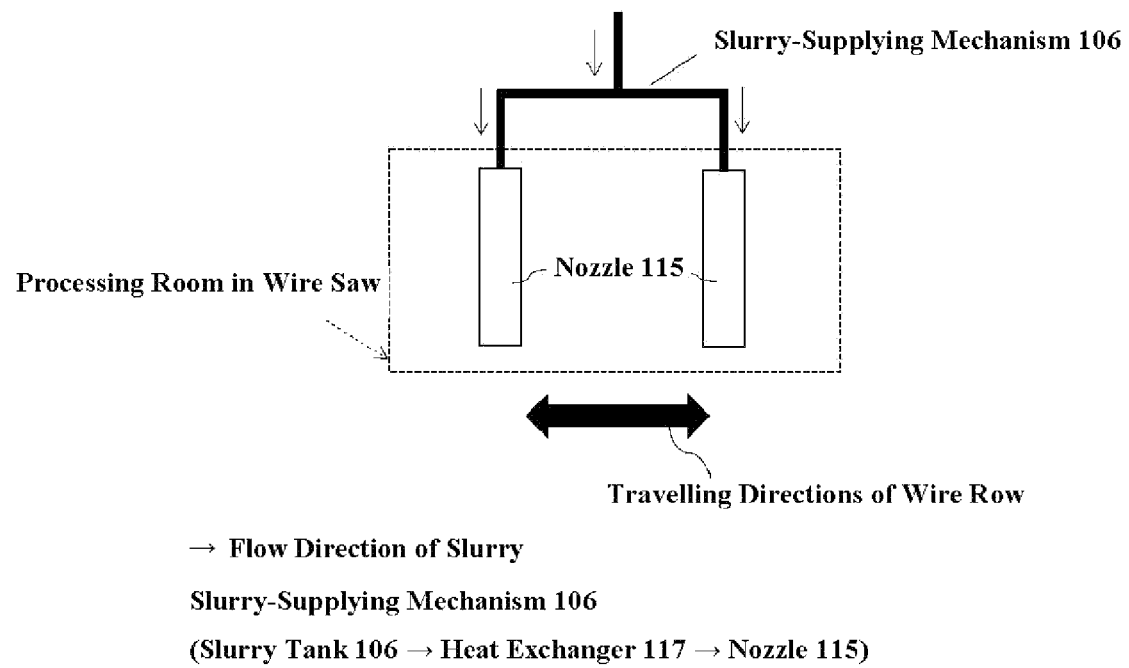

METHOD FOR SLICING INGOT AND WIRE SAW

TECHNICAL FIELD

The present invention relates to a method for slicing an ingot, and a wire saw.

BACKGROUND ART

Recently, larger wafers have been demanded, and a wire saw is mainly used to slice an ingot to cope with this increase in size. A wire saw is an apparatus that causes a wire (high tensile steel wire) to travel at a high speed, to which a workpiece (examples thereof include ingots of brittle materials such as silicon, glass, and ceramics, and such workpiece may be simply referred to as ingot hereinafter) is pressed and sliced while applying a slurry thereto, thereby cutting out many wafers simultaneously.

Here, FIG. 12 shows an outline of an example of a conventional wire saw. As shown in FIG. 12, a wire saw 101 mainly includes a wire 102 for slicing an ingot, a wire row 111 formed by winding the wire 102 around multiple wire guides 103, a tension-imparting mechanism 104 for imparting tension to the wire 102, an ingot-feeding means 105 for feeding the ingot to be sliced, etc. Moreover, the wire saw 101 has a slurry-supplying mechanism 106 constituted of a slurry tank 116, a heat exchanger 117, and a nozzle 115.

The wire 102 is reeled out from one wire reel 107, and reaches the wire guides 103 through a traverser 108 and the tension mechanism 104 constituted of a powder clutch (constant torque motor 109), a dancer roller (dead weight) (not shown), etc. After wound around the wire guides 103 approximately 300 to 400 times, the wire 102 passes through another tension-imparting mechanism 104' and is wound around a wire reel 107'.

Moreover, the wire guides 103 are rollers each provided by press-fitting a polyurethane resin around a steel cylinder and forming grooves on a surface thereof at a fixed pitch. The wound wire 102 can be driven in reciprocating directions in a predetermined cycle by a driving motor 110.

Note that when a workpiece is sliced, this ingot is held and pushed down by the ingot-feeding means 105. The nozzle 115 provided near the wire 102 wound around the wire guides 103 can supply the wire 102 with a slurry from the slurry tank 116 during the slicing. Moreover, the heat exchanger 117 is connected to the slurry tank 116, and can adjust the temperature of the slurry to be supplied.

The heat exchanger 117 controls the temperature of the slurry to be supplied such that a target temperature can be achieved at ingot slicing positions (cutting positions) set in advance. Thus, the slurry can be supplied at the controlled temperature as intended.

When an ingot is sliced, the wire guides 103 are extended in axial directions thereof due to friction heat with the wire and friction heat generated from bearings which movably support the wire guides. Hence, relative positions between the ingot and the wire row spirally wound around the wire guides are unintentionally changed during slicing in some cases.

It has been known that there is a certain correlation between the displacement in the axial directions of the grooved rollers and the temperature of a slurry supplied during ingot slicing (see Patent Document 1).

When the conventional wire saw 101 as described above is used, the wire-tension-imparting mechanism 104 applies appropriate tension to the wire 102, the driving motor 110 causes the wire 102 to travel in the reciprocating directions, and an ingot is sliced while a slurry is being supplied. Thus, desired sliced wafers are obtained.

CITATION LIST

Patent Literature

Patent Document 1: Japanese Unexamined Patent Application Publication No. H5-185419

SUMMARY OF INVENTION

Technical Problem

When wafers obtained by slicing an ingot with the wire saw 101 as described above are observed to check the warp forms in the workpiece (ingot) feeding direction, there are a wafer having a convex shape and a wafer having a concave shape, depending on the positions in the ingot.

This is attributable to thermal expansion during the ingot slicing, that is, while the ingot is being sliced, sliced portions of the ingot generate heat due to friction between the ingot and the wire. Accordingly, if the relative positions between the ingot and the wire are not changed, when the warp forms in the workpiece feeding direction are checked on both sides of the center of the ingot, this thermal expansion is likely to cause a wafer on the front side (wire-supply side) of the apparatus to have convex shape in comparison with a wafer at the center of the ingot, and to cause a wafer on the back side (wire-withdrawal side) of the apparatus to have concave shape in comparison with the wafer at the center of the ingot.

Wafers desirably have small warpage. As one of methods for controlling the wafer shape to reduce the warpage, there is a method in which the temperature of a slurry to be supplied is changed.

Since there is a correlation between slurry temperature and displacement of wire guides in the axial directions due to the extension as described above, the slurry temperature is changed in the control method to change the extent to which the wire guide shafts extend. Accordingly, this also changes the relative positions between the ingot and the wire wound around the wire guides, and consequently changes the slicing paths of the wire where the ingot is cut. In this manner, wafer shapes are controlled.

Specifically, for example, if wafers obtained from a block (ingot) in the last slicing are warped in convex shape with respect to the workpiece feeding direction, the temperature of a slurry to be supplied in the next ingot slicing is changed during the ingot slicing to compensate for the shape, that is, to make the wire paths draw concave shape.

Meanwhile, if wafers obtained from a sliced block are warped in concave shape with respect to the workpiece feeding direction, the temperature of a slurry to be supplied in the next ingot slicing is changed during the ingot slicing to compensate for the shape, that is, to make the wire paths draw convex shape.

When all wafers cut out have warp forms in the same direction irrespective of sliced positions in the ingot, such a method as described above can provide flatter wafers than those obtained before the slurry temperature is changed.

On the other hand, suppose a case where wafers at a central portion of an ingot have flat shape. Due to the thermal expansion of the ingot, wafers cut out from the apparatus front side tend to have convex shape, while wafers cut out from the apparatus back side tend to have concave shape.

In such a case, the slurry temperature condition aiming at concave shape formation is selected as the slurry temperature condition to flatten the convex-shaped wafers on the apparatus front side. In this way, wafers located on the apparatus front side in a block are made to have flat shape, and the purpose is accomplished. However, regarding wafers located on the opposite side of the center of the block, that is, on the apparatus back side, the original concave shape is newly formed into concave shape as a result of changing the slurry temperature. Speaking of the size of warps, wafers on the apparatus front side have smaller warps, whereas wafers on the apparatus back side have larger warps.

Meanwhile, in the case where wafers at a central portion of an ingot have flat shape, the slurry temperature condition aiming at convex shape formation is selected to flatten concave-shaped wafers on the apparatus back side. In this way, wafers located on the apparatus back side in a block are made to have flat shape, and the purpose is accomplished. However, regarding wafers located on the opposite side of the center of the block, that is, on the apparatus front side, the original convex shape is newly formed into convex shape as a result of changing the slurry temperature. Speaking of the size of warps, wafers on the apparatus back side have smaller warps, whereas wafers on the apparatus front side have larger warps.

As described above, in the conventional method for slicing an ingot, improving warps on one side degrades the other. In other words, it has been impossible to separately control wafer shapes depending on ingot-slicing positions (wafer-cutting positions), and difficult to reduce warps of wafers at all the positions in the ingot.

The present invention has been made to solve the above-described problems. An object of the present invention is to provide a method for slicing an ingot, the method enabling separate control of wafer shapes depending on ingot-slicing positions.

Solution to Problem

To achieve the object, the present invention provides a method for slicing an ingot, comprising:
forming a wire row by a wire spirally wound between a plurality of wire guides and configured to travel in an axial direction; and
pressing an ingot against the wire row while supplying a contact portion between the ingot and the wire with a slurry from a nozzle, thereby slicing the ingot into wafers, wherein
the slurry is supplied such that slurries whose temperatures are separately controlled by two or more lines of heat exchangers are respectively supplied from two or more sections of the nozzle which are orthogonal to a travelling direction of the wire row.

Such a method enables separate control of wafer shapes depending on ingot-slicing positions, and thereby makes it possible to reduce wafer warps at all the sliced positions in the ingot.

More preferably, in this event, the temperatures of the slurries are separately controlled depending on slurry-supply positions of the ingot to be sliced.

In this manner, controlling the temperatures according to the positions where slurries are supplied makes it possible to individually supply slurries of suitable temperatures for the respective ingot-slicing positions.

Further preferably, the slurry is supplied such that after an ingot is sliced in advance to check wafer shapes at sliced positions of the ingot, slurries whose temperatures are separately controlled depending on the shapes at the respective positions are supplied.

In this manner, wafer warps can be more effectively reduced at all the sliced positions in the ingot.

Furthermore, the slurry may be supplied such that, of the two or more sections of the nozzle,
at least one section supplies a slurry whose temperature is controlled to be changed during the ingot slicing, and
at least one section supplies a slurry whose temperature is controlled to be unchanged during the ingot slicing.

According to the present invention, it is also possible to supply slurries whose temperatures are controlled as described above for the respective sections of the nozzle.

Moreover, the present invention provides a wire saw comprising:
a wire row formed of a wire spirally wound between a plurality of wire guides and configured to travel in an axial direction;
an ingot-feeding means configured to press an ingot against the wire row while holding the ingot; and
a nozzle configured to supply a slurry to a contact portion between the ingot and the wire, wherein
the ingot-feeding means presses the ingot against the wire row while the nozzle supplies the slurry to the contact portion between the ingot and the wire, thereby slicing the ingot into wafers,
the wire saw comprises two or more lines of heat exchangers configured to separately control a temperature of the slurry,
the nozzle is divided in two or more sections in a direction orthogonal to a travelling direction of the wire row, and
the divided sections are respectively supplied with the separately controlled slurries from the heat exchangers.

Such a wire saw is capable of separately controlling wafer shapes depending on ingot-slicing positions, and thereby reducing wafer warps at all the sliced positions in the ingot.

Moreover, the two or more lines of heat exchangers may separately control the temperature of the slurry depending on slurry-supply positions of the ingot to be sliced.

The wire saw having such heat exchangers is a wire saw capable of individually supplying slurries having suitable temperatures for the respective ingot-slicing positions.

The two or more lines of heat exchangers may separately control the temperature of the slurry depending on wafer shapes checked at positions of an ingot sliced in advance.

The wire saw having such heat exchangers is capable of more effectively reducing wafer warps at all the sliced positions in the ingot.

Advantageous Effects of Invention

As described above, the present invention makes it possible to supply slurries whose temperatures are separately controlled depending on ingot-slicing positions. This enables separate control of wafer shapes according to ingot-slicing positions, and reductions of wafer warps at all the sliced positions in the ingot.

BRIEF DESCRIPTION OF DRAWINGS

FIG. 1 is a schematic view showing an example of a wire saw according to the present invention.

FIG. 2 is a top view showing an example of a nozzle in the inventive wire saw.

FIG. 3 is a graph for illustrating the slurry temperature condition for making a cut wafer have concave shape in Example, Comparative Example, and Reference Example.

FIG. 4 is a graph for illustrating the slurry temperature condition where the temperature is unchanged in Example and Comparative Example.

FIG. 5 is a graph for illustrating the slurry temperature condition for making a cut wafer have convex shape in Example, Comparative Example, and Reference Example.

FIG. 6 shows graphs for illustrating warp forms in an ingot feeding direction of sliced wafers in Comparative Example 1.

FIG. 7 shows graphs for illustrating warp forms in an ingot feeding direction of sliced wafers in Comparative Example 2.

FIG. 8 shows graphs for illustrating warp forms in an ingot feeding direction of sliced wafers in Comparative Example 3.

FIG. 9 shows graphs for illustrating warp forms in an ingot feeding direction of sliced wafers in Example 1.

FIG. 10 shows graphs for illustrating warp forms in an ingot feeding direction of sliced wafers in Example 2.

FIG. 11 shows graphs for illustrating warp forms in an ingot feeding direction of sliced wafers in Reference Example.

FIG. 12 is a schematic view showing an example of a conventional wire saw.

FIG. 13 is a top view showing an example of a nozzle in the conventional wire saw.

DESCRIPTION OF EMBODIMENTS

As described above, there have been demands for the development of a method for slicing an ingot, the method enabling separate control of wafer shapes depending on ingot-slicing positions.

The present inventor and colleagues have earnestly studied the above-described problems and consequently found that the reason why conventional methods for slicing an ingot cannot separately control wafer shapes depending on ingot-slicing positions is that the slurry temperature is controlled uniformly irrespective of ingot-slicing positions and cannot be changed. The inventor has arrived at controlling the slurry temperature with two or more lines separately instead of conventional one line. Thus, the present invention has been completed.

Specifically, the present invention provides a method for slicing an ingot, comprising:

forming a wire row by a wire spirally wound between a plurality of wire guides and configured to travel in an axial direction; and pressing an ingot against the wire row while supplying a contact portion between the ingot and the wire with a slurry from a nozzle, thereby slicing the ingot into wafers, wherein the slurry is supplied such that slurries whose temperatures are separately controlled by two or more lines of heat exchangers are respectively supplied from two or more sections of the nozzle which are orthogonal to a travelling direction of the wire row.

In addition, the present invention provides a wire saw comprising:

a wire row formed of a wire spirally wound between a plurality of wire guides and configured to travel in an axial direction;

an ingot-feeding means configured to press an ingot against the wire row while holding the ingot; and a nozzle configured to supply a slurry to a contact portion between the ingot and the wire, wherein the ingot-feeding means presses the ingot against the wire row while the nozzle supplies the slurry to the contact portion between the ingot and the wire, thereby slicing the ingot into wafers, the wire saw comprises two or more lines of heat exchangers configured to separately control a temperature of the slurry, the nozzle is divided in two or more sections in a direction orthogonal to a travelling direction of the wire row, and the divided sections are respectively supplied with the separately controlled slurries from the heat exchangers.

Hereinafter, the present invention will be described in detail, but the present invention is not limited thereto.

First, an example of the inventive wire saw will be described with reference to FIG. 1. As shown in FIG. 1, a wire saw 1 is mainly constituted of: a wire row 11 formed of a wire 2 wound around multiple wire guides 3 and configured to slice an ingot; an ingot-feeding means 5 configured to feed an ingot to be sliced; a nozzle 15 configured to supply, during slicing, a slurry in which abrasive grains are dispersed and mixed in a coolant; etc.

The wire 2 is reeled out from one wire reel 7, and reaches the wire guides 3 through a traverser 8 and a tension mechanism 4 constituted of a powder clutch (constant torque motor 9), a dancer roller (dead weight) (not shown), etc. After wound around the wire guides 3 approximately 300 to 400 times, the wire 2 passes through another tension-imparting mechanism 4' and is wound around a wire reel 7'.

Additionally, the wire guides 3 are rollers each obtained by press-fitting a polyurethane resin around a cylinder made of steel and forming grooves on a surface thereof at a fixed pitch. The wire 2 wound therearound can be driven in reciprocating directions in a predetermined cycle by a driving motor 10.

The wire saw 1 has two or more lines of heat exchangers configured to separately control the temperature of slurries. In the wire saw 1 shown in FIG. 1, two slurry-supplying mechanisms 6 and 6' configured to supply slurries are linked to one slurry tank 16, and the mechanisms respectively includes heat exchangers 17 and 17'. Nevertheless, the wire saw 1 may have three or more lines of heat exchangers.

The heat exchangers 17 and 17' are each capable of separately controlling slurry temperature and may have equal abilities. Existing heat exchangers can be used.

Moreover, the nozzle 15 according to the present invention is divided in two or more sections in a direction perpendicular to a travelling direction of the wire row 11. The divided sections are respectively supplied with separately-controlled slurries from the heat exchangers 17, 17'.

Here, the nozzle of the present invention and a slurry supply flow will be described in more details with reference to FIG. 2 and FIG. 13 that shows an example of a conventional nozzle.

As shown in FIG. 13, the nozzle 115 in the conventional wire saw 101 consists of one section. After temperature control by the heat exchanger 117, a slurry from the slurry tank 116 enters the slurry nozzle 115 through a pipe, and is supplied in free fall to the wire and the wire guides from slit in the bottom surface of the nozzle. Then, the slurry returns to the slurry tank 116 located at the bottom of the apparatus.

Meanwhile, as shown in FIG. 2, the nozzle 15 in the inventive wire saw 1 is divided into at least two sections in the direction orthogonal to the travelling directions of the wire row 11. In FIG. 2, the nozzle 15 is divided into two sections: a nozzle 15A and a nozzle 15B. The nozzle 15A is connected to a pipe through which a slurry whose temperature is controlled by the heat exchanger 17 flows. The nozzle 15B is connected to a pipe through which a slurry whose temperature is controlled by the other heat exchanger 17' flows. Thus, different slurries whose temperatures are separately controlled can be supplied from the respective sections of the single nozzle 15. The nozzle 15 may be divided, for example, by providing a partition plate or the like at a central portion inside the nozzle 15. The nozzles 15A and 15B are structured to prevent mixing of the slurries whose temperatures are controlled by the different lines. Although FIG. 2 shows the nozzle 15 divided into two sections, it is a matter of course that the nozzle 15 may be divided into three or more sections.

The slurry-supplying mechanism 6 shown in FIG. 1 and FIG. 2 is such a mechanism that a slurry from the slurry tank 16 is subjected to the temperature control by the heat exchanger 17, enters the nozzle 15A through the pipe, and is supplied in free fall from slit in the nozzle bottom surface to the wire and the wire guides located at one side (for example, wire-supply side) in the apparatus. Then, the slurry returns to the slurry tank 16 located at the bottom of the apparatus.

Moreover, the slurry-supplying mechanism 6' is such a mechanism that a slurry from the slurry tank 16 is subjected to the temperature control by the heat exchanger 17', enters the nozzle 15B through the pipe, and is supplied in free fall from slit in the nozzle bottom surface to the wire and the wire guides located at the other side (for example, wire-withdrawal side) in the apparatus. Then, the slurry returns to the slurry tank 16 located at the bottom of the apparatus.

In the present invention, the temperature control by the heat exchanger 17 or the heat exchanger 17' may differ from the other. Alternatively, it is possible to control the temperature at one side to be changeable and the temperature at the other side to remain unchanged.

Moreover, the heat exchangers 17, 17' may separately control slurry temperatures depending on slurry-supply positions in an ingot to be sliced. The wire saw 1 having such heat exchangers 17, 17' can separately supply slurries having suitable temperatures for the respective ingot-slicing positions.

Further, each of the heat exchangers 17, 17' may also control the temperature of the slurry depending on wafer shapes checked at positions of an ingot sliced in advance. The wire saw 1 having such heat exchangers 17, 17' can more effectively reduce wafer warps at all the sliced positions in the ingot.

As has been described above, the inventive wire saw 1 makes it possible to supply slurries having separately controlled temperatures depending on ingot-slicing positions, and thus enables separate controls of wafer shapes depending on ingot-slicing positions, and wafer warp reductions at all the sliced positions in the ingot.

Next, the inventive method for slicing an ingot will be described by taking an example where the above-described inventive wire saw 1 is used.

In the inventive method for slicing an ingot, slurries whose temperatures are separately controlled by two or more lines of heat exchangers (for example, the heat exchangers 17 and 17') are respectively supplied from two or more sections (for example, the nozzles 15A and 15B) of the nozzle 15 which are orthogonal to the travelling directions of the wire row 11.

In the inventive ingot slicing method, the slurry may be supplied such that, of the two or more sections of the nozzle 15, at least one section supplies a slurry whose temperature is changed during the ingot slicing, and at least one section supplies a slurry whose temperature is unchanged during the ingot slicing. The present invention makes it possible to supply slurries having the temperatures controlled in this manner for the respective sections of the nozzle.

For example, a slurry controlled under slurry temperature conditions aiming at concave shape formation to flatten wafers which otherwise have convex shape can be supplied from the apparatus front side. In addition, a slurry controlled under slurry temperature conditions aiming at convex shape formation to flatten wafers which otherwise have concave shape can be independently supplied from the apparatus back side. This process prevents such an incidence that improving warps on one side degrades warps on the other side. Thus, wafer warp reductions are achieved at all the sliced positions in an ingot.

EXAMPLE

Hereinafter, the present invention will be specifically described with reference to Examples, Comparative Examples, and Reference Example. However, the present invention is not limited thereto.

Comparative Example 1

The conventional wire saw 101 as shown in FIG. 12 was used to slice an ingot under the condition as in FIG. 4 where the slurry temperature was unchanged. Then, the wafer shapes at the sliced positions were observed.

FIG. 6 shows wafer shapes thus cut out. As shown in FIG. 6, the wafer shape cut out from the apparatus front side (wire-supply side) relative to the center of the ingot was a convex shape, while the wafer shape cut out from the apparatus back side (wire-withdrawal side) relative to the center of the ingot was a concave shape. It should be noted that, in the subsequent Comparative Examples 2 and 3 and Examples 1 and 2, the warps of wafer shapes were evaluated through comparison with the wafer shapes obtained in Comparative Example 1 which were regarded as existing shapes.

Comparative Example 2

The same procedure as in Comparative Example 1 was conducted, except that an ingot was sliced under the condition as in FIG. 3 where the slurry temperature was controlled to form wafers having concave shape.

FIG. 7 shows wafer shapes thus cut out. As shown in FIG. 7, the wafer shape cut out from the apparatus front side was a flat shape instead of the existing convex shape. However, the wafer shape cut out from the apparatus back side was a deeper concave shape than the existing concave shape.

Comparative Example 3

The same procedure as in Comparative Example 1 was conducted, except that an ingot was sliced under the condition as in FIG. 5 where the slurry temperature was controlled to form wafers having convex shape.

FIG. 8 shows wafer shapes thus cut out. As shown in FIG. 8, the wafer shape cut out from the apparatus back side was a flat shape instead of the existing concave shape. However, the wafer shape cut out from the apparatus front side was a deeper convex shape than the existing convex shape.

Example 1

The inventive wire saw 1 as shown in FIG. 1 was used to slice an ingot while slurries whose temperatures were separately controlled by two lines of the heat exchangers 17, 17' were respectively supplied from the apparatus front side and the apparatus back side relative to the center of the ingot.

The temperature of the slurry supplied from the apparatus front side was changed during the ingot slicing as in FIG. 3 to form wafers having concave shape. The temperature of the slurry supplied from the apparatus back side was unchanged as in FIG. 4. FIG. 9 shows wafer shapes thus cut out.

As shown in FIG. 9, regarding the wafer shape cut out from the apparatus front side where the temperature of the supplied slurry was changed to form concave shape, a flat shape was formed by counterbalancing the warp direction of the existing convex shape. Meanwhile, regarding the wafer shape cut out from the apparatus back side where the temperature of the supplied slurry was unchanged, the resulting shape was equivalent to that in Comparative Example 1.

Example 2

An ingot was sliced as in Example 1, except that a slurry was supplied from the apparatus back side under the temperature condition as in FIG. 5 to form convex shape in place of the existing concave shape. FIG. 10 shows wafer shapes cut out from the apparatus front side and the apparatus back side.

As shown in FIG. 10, the wafer on the apparatus front side had a flat shape as in Example 1 by counterbalancing the warp direction as if the convex shape as the existing warp form was changed in a concave direction. Moreover, as to the wafer on the apparatus back side where the control was aimed in the opposite direction as well, a flat shape was formed by counterbalancing the warp direction as if the existing concave shape was changed in a convex direction.

Reference Example

An ingot was sliced while the slurry temperatures were controlled in manners opposite to those in Example 2; specifically, the temperature of a slurry supplied from the apparatus front side varied as in FIG. 5, and the temperature of a slurry supplied from the apparatus back side varied as in FIG. 3. FIG. 11 shows wafer shapes thus cut out.

As shown in FIG. 11, the wafer shape cut out from the apparatus front side was a convex shape that was sharper than the convex shape of the existing warp form. Moreover, the wafer shape cut out from the apparatus back side was a sharper concave shape, and the flatness was degraded.

Table 1 summarizes the results of Examples, Comparative Examples, and Reference Example.

TABLE 1

| | Wafer shape | | | |
| | Apparatus front side | Apparatus back side | | Evaluation |
| --- | --- | --- | --- | --- |
| Comparative Example 1 | convex | | concave | — |
| Comparative Example 2 | flat improved | sharper concave | degraded | One side was improved, the other was degraded | C |
| Comparative Example 3 | sharper convex degraded | flat | improved | One side was improved, the other was degraded | C |
| Example 1 | flat improved | concave | no change | Only one side was improved, the other was not changed | B |
| Example 2 | flat improved | flat | improved | Both sides were improved | A |
| Reference Example | sharper convex degraded | sharper concave | degraded | Both sides were degraded | D |

Evaluation
A: excellent
B: good
C: partially problematic
D: problematic

In Comparative Examples 2 and 3 where the slurry was supplied while the temperature was controlled uniformly irrespective of ingot-slicing positions, separate controls of the wafer shapes depending on ingot-slicing positions were not possible. Although the slurry temperature condition was changed to improve wafer shapes cut out from either one of the apparatus back side or the apparatus front side, this resulted in harmful effects on the wafer shapes cut out from the other side.

In contrast, in Example 1 where the temperatures of the supplied slurries were separately controlled depending on ingot-slicing positions, the change in the slurry temperature condition to improve either one of the apparatus back side or the apparatus front side did not influence the other side. Furthermore, it was possible to improve both sides as in Example 2.

The above results verified that the present invention enables separate control of wafer shapes depending on ingot-slicing positions. Particularly, in Example 2, since the slurries were separately supplied depending on the ingot positions under the temperature conditions to counterbalance the warp directions, wafer warps were successfully reduced at all the sliced positions in the ingot.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A method for slicing a first ingot, comprising:
   forming a wire row by a wire spirally wound between a plurality of wire guides, the wire being configured to travel in an axial direction of the wire; and
   pressing the first ingot against the wire row while supplying a contact portion between the first ingot and the wire with slurries from a nozzle, thereby slicing the first ingot into wafers, wherein
   the slurries are supplied such that slurries whose temperatures are separately controlled by two or more lines of heat exchangers are respectively supplied from two or more divided sections of the nozzle, the two or more divided sections of the nozzle being arranged adjacent to each other along a direction orthogonal to the axial direction of the wire.

2. The method according to claim 1, wherein the temperatures of the slurries are separately controlled depending on slurry-supply positions of the first ingot to be sliced.

3. The method according to claim 2, wherein a second ingot is sliced in advance to check wafer shapes at sliced positions of the second ingot, and the temperatures of the slurries are separately controlled during slicing of the first ingot based on the wafer shapes at the sliced positions.

4. The method according to claim 3, wherein the slurries are supplied such that, of the two or more sections of the nozzle,
   at least a first section supplies a first slurry of the slurries with a temperature that is controlled to be changed during the ingot slicing, and
   at least a second section supplies a second slurry of the slurries with a temperature that is controlled to be unchanged during the ingot slicing.

5. The method according to claim 2, wherein the slurries are supplied such that, of the two or more sections of the nozzle,
   at least a first section supplies a first slurry of the slurries with a temperature that is controlled to be changed during the ingot slicing, and
   at least a second section supplies a second slurry of the slurries with a temperature that is controlled to be unchanged during the ingot slicing.

6. The method according to claim 1, wherein a second ingot is sliced in advance to check wafer shapes at sliced positions of the second ingot, and the temperatures of the slurries are separately controlled during slicing of the first ingot based on the wafer shapes at the sliced positions.

7. The method according to claim 6, wherein the slurries are supplied such that, of the two or more sections of the nozzle,
   at least a first section supplies a first slurry of the slurries with a temperature that is controlled to be changed during the ingot slicing, and
   at least a second section supplies a second slurry of the slurries with a temperature that is controlled to be unchanged during the ingot slicing.

8. The method according to claim 1, wherein the slurries are supplied such that, of the two or more sections of the nozzle,
   at least a first section supplies a first slurry of the slurries with a temperature that is controlled to be changed during the ingot slicing, and
   at least a second section supplies a second slurry of the slurries with a temperature that is controlled to be unchanged during the ingot slicing.

9. The method according to claim 1, wherein the nozzle includes a partition that divides the nozzle to create the two or more sections of the nozzle.

10. A wire saw comprising:
    a wire row formed of a wire spirally wound between a plurality of wire guides, the wire being configured to travel in an axial direction of the wire;
    an ingot-feeding means configured to press a first ingot against the wire row while holding the first ingot; and
    a nozzle configured to supply slurries to a contact portion between the first ingot and the wire, wherein
    the ingot-feeding means presses the first ingot against the wire row while the nozzle supplies the slurries to the contact portion between the first ingot and the wire, thereby slicing the first ingot into wafers,
    the wire saw comprises two or more lines of heat exchangers configured to separately control a temperature of each slurry,
    the nozzle is divided in two or more sections arranged adjacent to each other along a direction orthogonal to the axial direction of the wire, and
    the two or more sections of the nozzle are respectively supplied with the separately controlled slurries from the heat exchangers.

11. The wire saw according to claim 10, wherein the two or more lines of heat exchangers separately control the temperatures of the slurries depending on slurry-supply positions of the first ingot to be sliced.

12. The wire saw according to claim 11, wherein the two or more lines of heat exchangers separately control the temperatures of the slurries during slicing of the first ingot based on wafer shapes checked at sliced positions of a second ingot sliced in advance.

13. The wire saw according to claim 10, wherein the two or more lines of heat exchangers separately control the temperatures of the slurries during slicing of the first ingot based on wafer shapes checked at sliced positions of a second ingot sliced in advance.

14. The wire saw according to claim 10, wherein the nozzle includes a partition that divides the nozzle to create the two or more sections of the nozzle.

* * * * *